(12) United States Patent
Choi et al.

(10) Patent No.: US 12,205,668 B2
(45) Date of Patent: Jan. 21, 2025

(54) SEMICONDUCTOR DEVICE WITH ADJUSTMENT OF PHASE OF DATA SIGNAL AND CLOCK SIGNALS, AND MEMORY SYSTEM INCLUDING THE SAME

(71) Applicant: SAMSUNG ELECTRONICS CO., LTD., Suwon-si (KR)

(72) Inventors: Jaemin Choi, Suwon-si (KR); Yonghun Kim, Hwaseong-si (KR); Jaewoo Jeong, Daejeon (KR); Kyungryun Kim, Seoul (KR); Yoochang Sung, Hwaseong-si (KR); Changsik Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 103 days.

(21) Appl. No.: 17/722,805

(22) Filed: Apr. 18, 2022

(65) Prior Publication Data

US 2023/0032415 A1    Feb. 2, 2023

(30) Foreign Application Priority Data

Jul. 28, 2021  (KR) .................... 10-2021-0099466
Oct. 27, 2021  (KR) .................... 10-2021-0144471

(51) Int. Cl.
*G11C 7/10*   (2006.01)
(52) U.S. Cl.
CPC .......... *G11C 7/1066* (2013.01); *G11C 7/1063* (2013.01); *G11C 7/109* (2013.01); *G11C 7/1093* (2013.01)

(58) Field of Classification Search
CPC ..... G11C 7/1066; G11C 7/1063; G11C 7/109; G11C 7/1093
See application file for complete search history.

(56) References Cited

U.S. PATENT DOCUMENTS

| | | | |
|---|---|---|---|
| 7,036,053 B2 * | 4/2006 | Zumkehr ............. | G11C 7/1051 714/719 |
| 7,733,727 B2 * | 6/2010 | Hwang ................ | G11C 7/1084 365/207 |
| 7,872,937 B2 | 1/2011 | Searles et al. | |
| 8,144,542 B2 | 3/2012 | Na | |
| 8,843,778 B2 * | 9/2014 | Lee ......................... | G06F 3/067 365/194 |
| 10,148,416 B2 | 12/2018 | Morris et al. | |

(Continued)

FOREIGN PATENT DOCUMENTS

KR    10-2010-0058605    6/2010

*Primary Examiner* — Vanthu T Nguyen
(74) *Attorney, Agent, or Firm* — Fish & Richardson P.C.

(57) ABSTRACT

A semiconductor device includes: a plurality of pads connected to a memory device receiving a data signal using first to fourth clock signals having different phases; a data transmission/reception circuit inputting and outputting the data signal to a plurality of data pads of the plurality of pads and including a data delay cell adjusting a phase of the data signal; a clock output circuit outputting first to fourth clock signals to a plurality of clock pads of the plurality of pads and including first to fourth clock delay cells adjusting phases of the first to fourth clock signals; and a controller adjusting a delay amount of at least one of the first to fourth clock delay cells and the data delay cell so that each of the first to fourth clock signals is aligned with the data signal in the memory device.

20 Claims, 17 Drawing Sheets

(56) References Cited

U.S. PATENT DOCUMENTS

| | | |
|---|---|---|
| 10,255,964 B2 * | 4/2019 | Shin .................... G11C 11/4096 |
| 10,714,149 B2 * | 7/2020 | Jeon ...................... G06F 3/0673 |
| 10,991,446 B2 | 4/2021 | Kim |
| 11,307,926 B2 * | 4/2022 | Kim .................... G06F 11/0751 |
| 2009/0059641 A1 | 3/2009 | Jeddeloh |
| 2021/0104273 A1 | 4/2021 | Tsukihashi |
| 2021/0110861 A1 | 4/2021 | Yoshida et al. |

* cited by examiner

SEMICONDUCTOR DEVICE WITH ADJUSTMENT OF PHASE OF DATA SIGNAL AND CLOCK SIGNALS, AND MEMORY SYSTEM INCLUDING THE SAME

CROSS-REFERENCE TO RELATED APPLICATIONS

This application claims the benefit under 35 U.S.C. 119(a) of Korean Patent Application No. 10-2021-0099466, filed on Jul. 28, 2021, in the Korean Intellectual Property Office, and Korean Patent Application No. 10-2021-0144471, filed on Oct. 27, 2021, in the Korean Intellectual Property Office, the entire disclosures of which are incorporated herein by reference for all purposes.

BACKGROUND

1. Field

Embodiments relate to a semiconductor device and a memory system including the same.

2. Description of the Related Art

A memory device may provide a function of writing and erasing data, or reading recorded data, in response to a control signal received from an external controller. The memory device may receive data from the controller and store the data in memory cells.

SUMMARY

According to an embodiment, a semiconductor device includes: a plurality of pads connected to a memory device receiving a data signal using first to fourth clock signals having different phases; a data transmission/reception circuit configured to input and output the data signal to a plurality of data pads among the plurality of pads and including a data delay cell adjusting a phase of the data signal; a clock output circuit configured to output first to fourth clock signals to a plurality of clock pads among the plurality of pads and including first to fourth clock delay cells adjusting phases of the first to fourth clock signals; and a controller configured to adjust a delay amount of at least one of the data delay cell and the first to fourth clock delay cells so that each of the first to fourth clock signals is aligned with the data signal in the memory device.

According to an embodiment, a memory system includes: a host configured to output first to fourth clock signals having different phases; and a memory device configured to operate using at least one of the first to fourth clock signals as a system clock, store data received together with a program command from the host, and output data to the host in response to a read command received from the host, wherein each of the memory device and the host includes at least one data pad connected to a transmission path of a data signal including the data, and first to fourth clock pads connected to transmission paths of the first to fourth clock signals, and the host compares the first clock signal and the data signal with each other, adjusts a phase of at least one of the data signal and the first clock signal, and adjusts a phase of each of the second to fourth clock signals based on the first clock signal.

According to an embodiment, a memory system includes: a host configured to output first to fourth clock signals having different phases; and a memory device configured to operate using at least one of the first to fourth clock signals as a system clock, store data received together with a program command from the host, and output data to the host in response to a read command received from the host, wherein each of the memory device and the host includes at least one data pad connected to a transmission path of a data signal including the data, and first to fourth clock pads connected to transmission paths of the first to fourth clock signals, and the host adjusts a phase of each of the second to fourth clock signals based on the first clock signal, and adjusts a phase of the data signal based on the first to fourth clock signals.

BRIEF DESCRIPTION OF DRAWINGS

Features will become apparent to those of skill in the art by describing in detail example embodiments with reference to the attached drawings in which.

DETAILED DESCRIPTION

Figure 1:
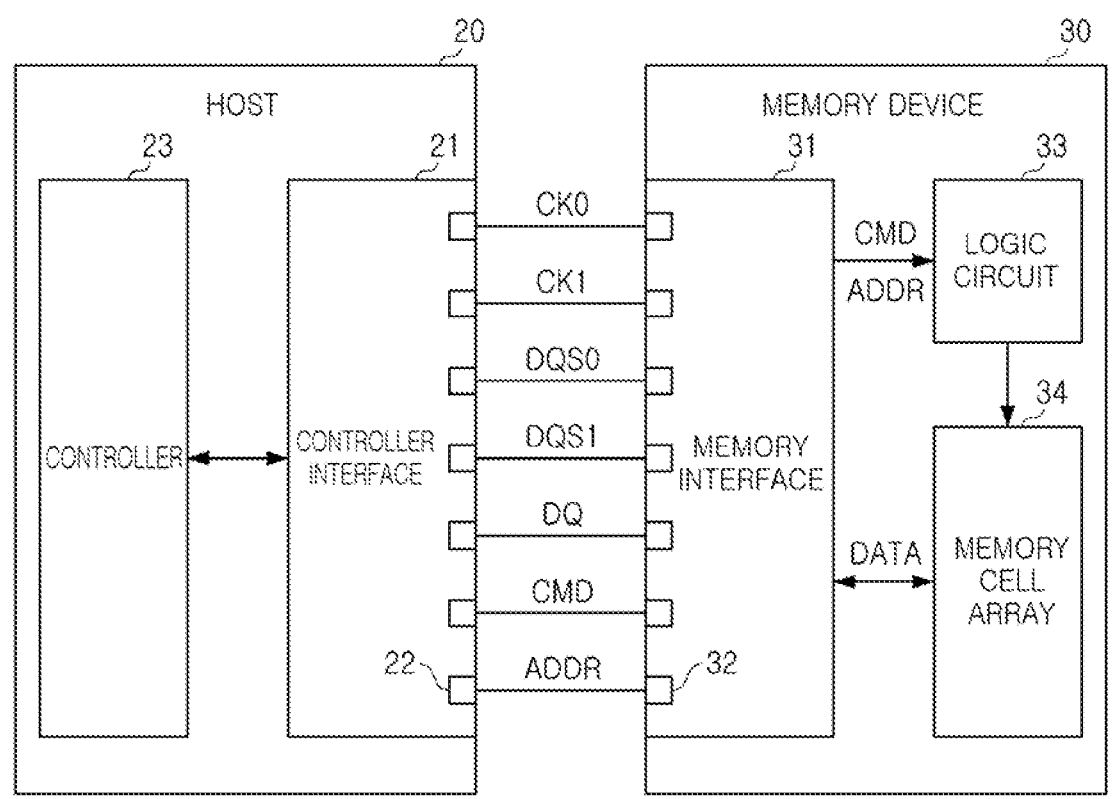
FIGS. 1 and 2 are block diagrams provided in order to describe operations of memory systems according to an example embodiment.
Figure 2:
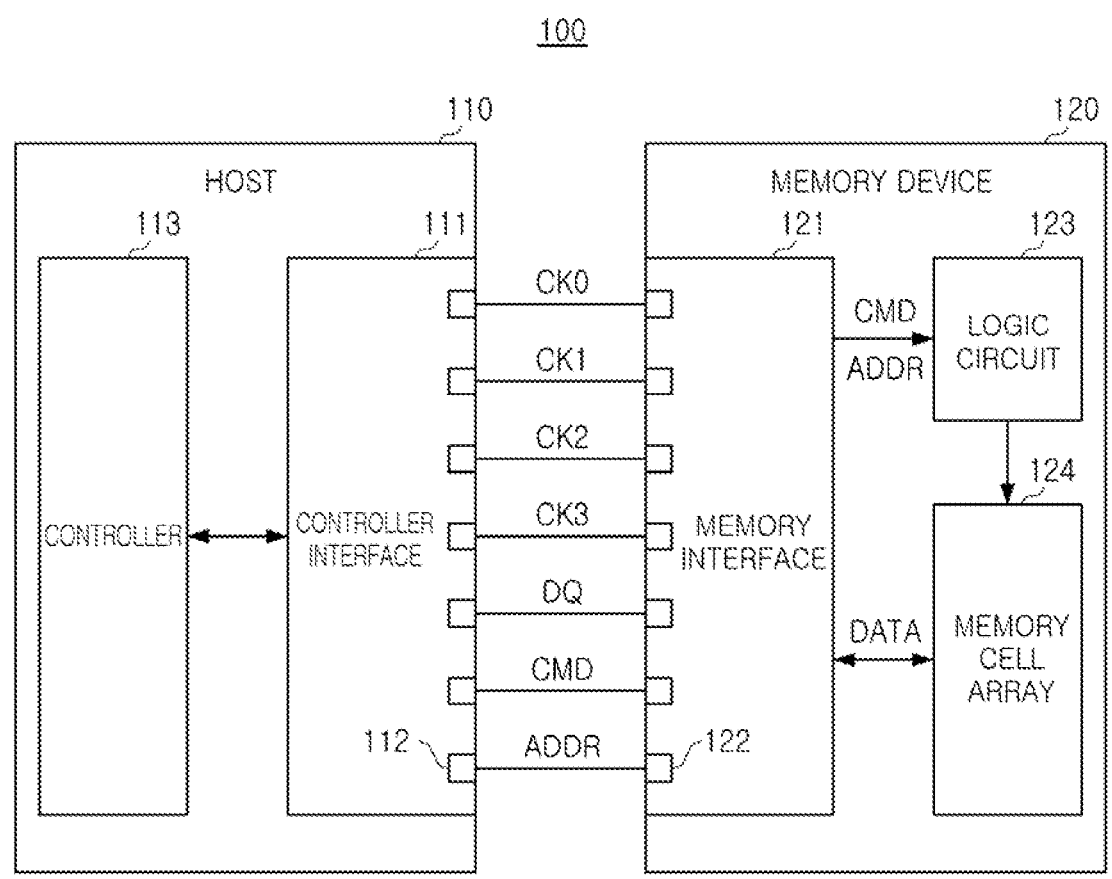

FIGS. 1 and 2 are block diagrams provided in order to describe operations of memory systems according to an example embodiment. FIG. 1 illustrates, as a comparative example, a schematic block diagram of a general memory system 10. FIG. 2 illustrates a schematic block diagram of a memory system 100 according to an example embodiment.

First, referring to FIG. 1, a general memory system 10 according to the comparative example may include a host 20 and a memory device 30.

The host 20 may include a controller 23 capable of controlling the memory device 30, may exchange a data signal DQ with the memory device 30 through a controller interface 21, and may transmit a command signal CMD and an address signal ADDR to the memory device 30.

The memory device 30 may be connected to the host 20 through the memory interface 31, and may include a logic circuit 33, a memory cell array 34, and the like. A plurality of signal transmission paths may be formed between pads 22 of the controller interface 21 and pads 32 of the memory interface 31.

The memory device 30 may operate based on clock signals CK0 and CK1, data strobe signals DQS0 and DQS1, and the like, transmitted by the host 20. The clock signals CK0 and CK1 may have opposite phases, and the data strobe signals DQS0 and DQS1 may also have opposite phases.

In the general memory system 10, the memory device 30 may receive or output the data signal DQ based on the data strobe signals DQS0 and DQS1. Accordingly, a data transfer rate between the host 20 and the memory device 30 may be increased by increasing frequencies of the data strobe signals DQS0 and DQS1. However, the ability to increase the data transfer rate between the host 20 and the memory device 30 by increasing frequencies of the data strobe signals DQS0 and DQS1 may be limited.

Next, referring to FIG. 2, the memory system 100 according to an example embodiment may include a host 110 and a memory device 120.

The host 110 may be or include an arithmetic processing device such as an application processor, a central processing unit, or a system-on-chip, and may include a controller interface 111 and a controller 113.

The memory device 120 may include a memory interface 121, a logic circuit 123, a memory cell array 124, and the like.

A plurality of signal transmission paths may be formed between pads 112 of the controller interface 111 and pads 122 of the memory interface 121.

The memory device 120 may receive clock signals CK (e.g., a first clock signal CK0, a second clock signal CK1, a third clock signal CK2, and a fourth clock signal CK3), a command signal CMD, an address signal ADDR, and the like, from the host 110, and exchange a data signal DQ with the host 110, through the memory interface 121.

In further detail, the host 110 may transmit the first to fourth clock signals CK0 to CK3 having different phases to the memory device 120. The memory device 120 may generate data strobe signals using at least some of first to fourth clock signals CK0 to CK3. The memory device 120 may not separately receive the data strobe signals DQS0 and DQS1, unlike the comparative example illustrated in FIG. 1.

In the example embodiment described with reference to FIG. 2, a data transfer rate between the host 110 and the memory device 120 may be improved using the first to fourth clock signals CK0 to CK3.

In an example embodiment, the second clock signal CK1 may have a phase difference of 90° with respect to the first clock signal CK0, the third clock signal CK2 may have a phase difference of 180° with respect to the first clock signal CK0, and the fourth clock signal CK3 may have a phase difference of 270° with respect to the first clock signal CK0. Accordingly, rising edges of each of the first to fourth clock signals CK0 to CK3 may appear in order. When the memory device 120 receives the data signal DQ, the memory device 120 may sample the data signal DQ at the rising edges of each of the first to fourth clock signals CK0 to CK3. Accordingly, the data transfer rate between the host 110 and the memory device 120 may be increased by using the first to fourth clock signals CK0 to CK3 having the same frequency as the data strobe signals DQS0 and DQS1 in the comparative example illustrated in FIG. 1.

When comparing the comparative example of FIG. 1 and the example embodiment of FIG. 2 with each other, in the example embodiment illustrated in FIG. 2, the data signal DQ may be processed using the first to fourth clock signals CK0-CK3 as the data strobe signals, and thus, there may be no separate signal paths through which the data strobe signals are transmitted. Accordingly, the number of signal transmission paths connecting the host 110 and the memory device 120 to each other may be the same as that in the comparative example of FIG. 1. In other words, the numbers of pads 112 and 122 included respectively in the controller interface 111 and the memory interface 121 may be the same as in those in the comparative example of FIG. 1.

Under some conditions, it is possible that phase skew between the first to fourth clock signals CK0 to CK3 may occur due to various causes, and a difference between effective time periods during which the data signal may be sampled in sampling circuits sampling the data signal DQ in synchronization with the first to fourth clock signals CK0 to CK3 may occur.

With reference to the above, in an example embodiment, the host 110 may remove phase skew between the first to fourth clock signals CK0 to CK3, align phases of the first to fourth clock signals CK0 to CK3 and the data signal DQ with each other, and transmit the first to fourth clock signals CK0 to CK3 and the data signal DQ to the memory device 120.

As an example, the controller interface 111 of the host 110 may intentionally misalign the first to fourth clock signals CK0 to CK3 and the data signal DQ with each other, and then output the first to fourth clock signals CK0 to CK3 and the data signal DQ so that the phases of the data signal DQ and the first to fourth clock signals CK0 to CK3 may be aligned with each other in the sampling circuits inside the memory device 120. This will be described in additional detail below.

Figure 3:
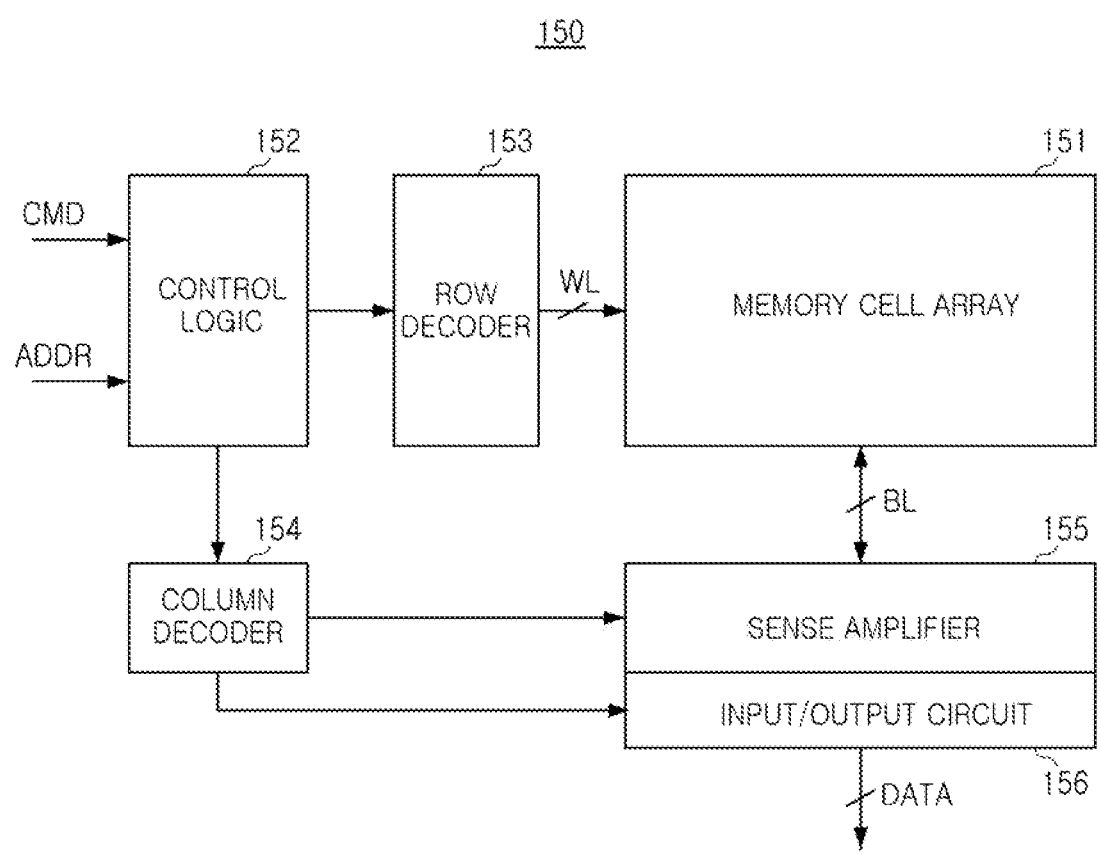
FIGS. 3 and 4 are, respectively, a schematic block diagram and a schematic circuit diagram illustrating a memory device according to an example embodiment.
Figure 4:
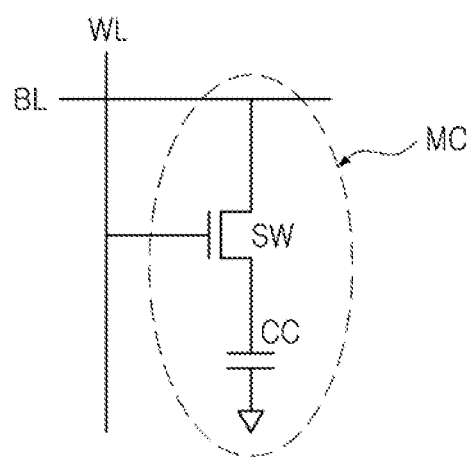

FIGS. 3 and 4 are, respectively, a schematic block diagram and a schematic circuit diagram illustrating a memory device according to an example embodiment.

Referring to FIG. 3, a memory device 150 according to an example embodiment may be a storage device based on a semiconductor element. The memory device 150 may be a random access memory (RAM) device such as a dynamic random access memory (DRAM), a synchronous DRAM (SDRAM), a static RAM (SRAM), a double date rate SDRAM (DDR SDRAM), a DDR2 SDRAM, a DDR3 SDRAM, a phase-change RAM (PRAM), a magnetic RAM (MRAM), or a resistive RAM (RRAM).

The memory device 150 may store data received through the data signal DQ or may output data as the data signal DQ in response to an address signal ADDR and a command signal CMD received from an external host (e.g., a central processing unit (CPU), an application processor (AP), or a system-on-chip (SoC)).

The memory device 150 may include a memory cell array 151, a control logic 152, a row decoder 153, a column decoder 154, a sense amplifier 155, and an input/output circuit 156.

The memory cell array 151 may include a plurality of memory cells. The plurality of memory cells may be connected to the row decoder 153 and the sense amplifier 155 through a plurality of word lines WL and a plurality of bit lines BL. The plurality of memory cells may be positioned, respectively, at points where the plurality of word lines WL and the plurality of bit lines BL intersect each other. The plurality of memory cells may be arranged in a matrix form in the memory cell array 210, and each of the plurality of memory cells may include at least one memory element for storing data.

In the case that the memory device 150 is the DRAM, each of the plurality of memory cells MC may include a switch element SW and a cell capacitor CC, as illustrated in FIG. 4. Data may be written to the memory cell MC by charging or discharging electric charges in or from the cell capacitor CC by the sense amplifier 155.

The control logic 152 may receive the address signal ADDR and the command signal CMD from the host. The address signal ADDR may include a row address indicating a row in the memory cell array 210 and a column address indicating a column in the memory cell array 210. As an example, the row decoder 153 may select at least one of the plurality of word lines WL with reference to the row address, and the column decoder 154 may select at least one of the plurality of bit lines BL by referring to the column address.

The sense amplifier 155 may include a plurality of bit line sense amplifiers connected to the memory cell array 151 through the plurality of bit lines. A bit line sense amplifier connected to a selected bit line selected by the column decoder 154 among the plurality of bit line sense amplifiers may read data from at least one of memory cells connected to the selected bit line. The input/output circuit 156 may output the data read by the bit line sense amplifier as the data signal DQ.

Figure 5:
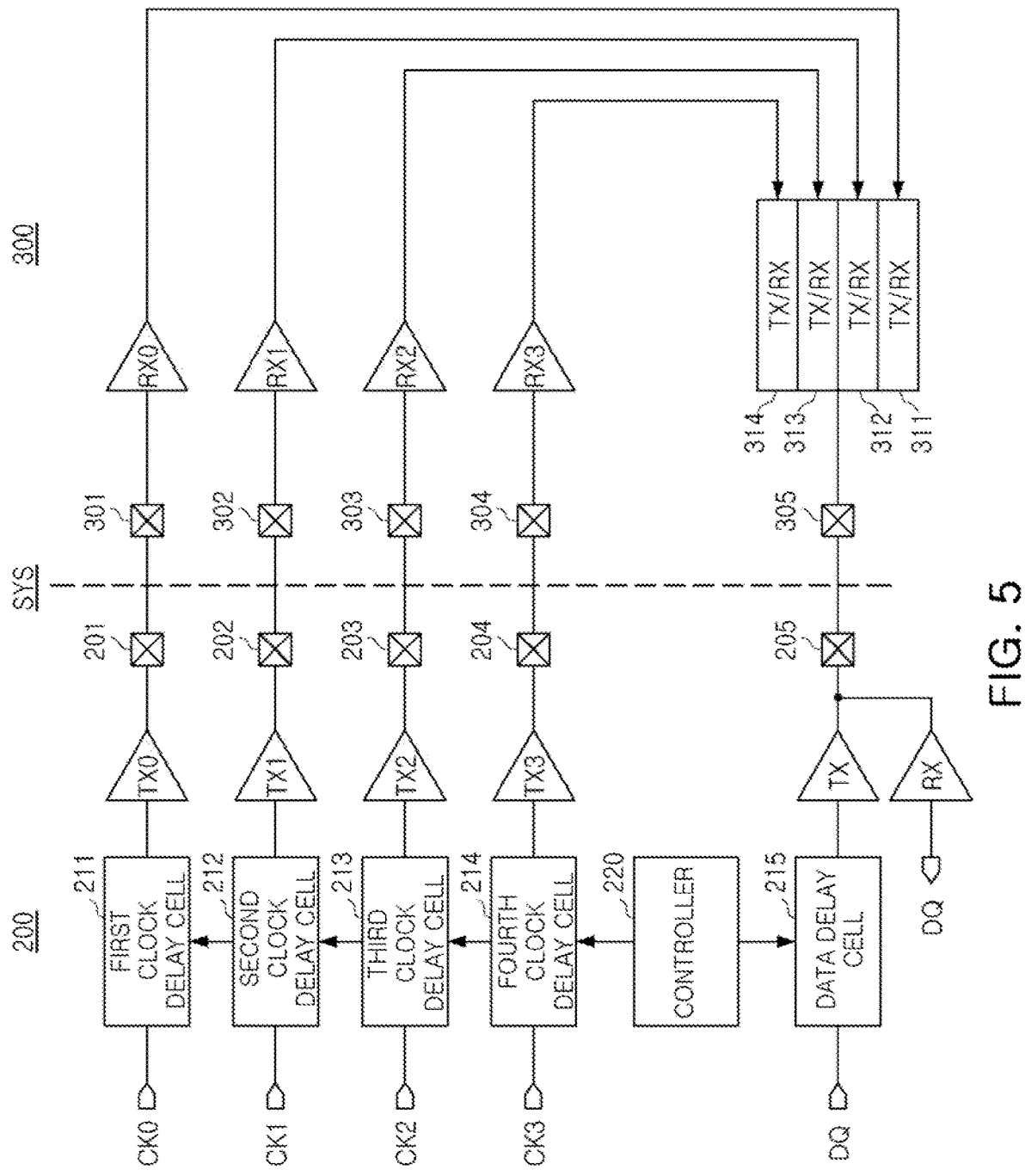
FIG. 5 is a schematic block diagram illustrating a memory system according to an example embodiment.

FIG. 5 is a schematic block diagram illustrating a memory system according to an example embodiment.

Referring to FIG. 5, a memory system SYS according to an example embodiment may include a host 200 and a memory device 300.

The host 200 may generate first to fourth clock signals CK0 to CK3 and output the first to fourth clock signals CK0 to CK3 to the memory device 300.

The memory device 300 may operate in synchronization with the first to fourth clock signals CK0 to CK3. As an example, using the first to fourth clock signals CK0 to CK3, the memory device 300 may generate a system clock signal that is used for an operation. In an example embodiment, the memory device 300 may generate the system clock signal using a pair of the clock signals, e.g., the first and third clock signals CK0 and CK2, having opposite phases, i.e., a phase difference of 180° therebetween.

The host 200 may include a plurality of transmitters TX0 to TX3 outputting the first to fourth clock signals CK0 to CK3. In the host 200, output terminals of the plurality of transmitters TX0 to TX3 may be connected to a plurality of clock pads 201 to 204, respectively.

In the host 200, first to fourth clock delay cells 211 to 214 may be connected to input terminals of the plurality of transmitters TX0 to TX3, respectively. A controller 220 of the host 200 may control each of the first to fourth clock delay cells 211 to 214 to adjust a phase of each of the first to fourth clock signals CK0 to CK3.

The first to fourth clock delay cells 211 to 214 and the plurality of transmitters TX0 to TX3 may provide clock output circuits of the host 200.

The host 200 may include a data pad 205 in addition to first to fourth clock pads 201 to 204. The data pad 205 may be connected to an output terminal of a transmitter TX (for outputting a data signal DQ to the memory device 300) and an input terminal of a receiver RX (for receiving a data signal DQ from the memory device 300). The transmitter TX and the receiver RX may provide a data transmission/reception circuit transmitting and receiving data in the host 200.

The input terminal of the transmitter TX may be connected to a data delay cell 215, and the controller 220 may control the data delay cell 215 to adjust a phase of the data signal DQ output to the data pad 205.

In an example embodiment, the first to fourth clock delay cells 211 to 214 and the data delay cell 215 may include a phase lock circuit.

The host 200 may include a plurality of data pads 205. Each of the plurality of data pads 205 included in the host 200 may be connected to one data transmission/reception circuit. A respective data delay cell 215 may be connected to each of the plurality of data pads 205. Accordingly, the controller 220 may independently adjust phases of the data signals DQ output through each of the plurality of data pads 205.

The memory device 300 may include first to fourth clock pads 301 to 304 connected respectively to the first to fourth clock pads 201 to 204 of the host 200. The first to fourth clock pads 301 to 304 may be connected to input terminals of the first to fourth receivers RX0 to RX3 receiving the first to fourth clock signals CK0 to CK3, respectively.

The memory device 300 may include a data pad 305 for connection to the data pad 205 of the host 200. The data pad 305 may be connected to a plurality of transmitters TX and a plurality of receivers RX. As an example, the plurality of transmitters TX may be paired with the plurality of receivers RX, respectively, to provide a plurality of data transmission/reception circuits 311 to 314, and may be connected to the data pad 305.

Each of the plurality of data transmission/reception circuits 311 to 314 may include a sampling circuit connected to an output terminal of the receiver RX. The sampling circuit may operate in synchronization with one of the first to fourth clock signals CK0 to CK3.

For example, a first sampling circuit included in a first data transmission/reception circuit 311 may sample an output of the receiver RX at a rising edge of the first clock signal CK0, a second sampling circuit included in a second data transmission/reception circuit 312 may sample an output of the receiver RX at a rising edge of the second clock signal CK1, a third sampling circuit included in a third data transmission/reception circuit 313 may sample an output of the receiver RX at a rising edge of the third clock signal CK2, and a fourth sampling circuit included in a fourth data transmission/reception circuit 314 may sample an output of the receiver RX at a rising edge of the fourth clock signal CK3.

The second clock signal CK1, the third clock signal CK2, and the fourth clock signal CK3 may have phase differences of 90°, 180°, and 270°, respectively, with respect to the first clock signal CK0. Accordingly, data transmitted as the data signal DQ may be sequentially sampled by the first to fourth sampling circuits.

Under some conditions, it is possible that a phase skew may exist between the first to fourth clock signals CK0 to CK3 input to the first to fourth sampling circuits of the memory device 300 and the data signal DQ, which may result in a difference between effective time periods during which the data signal DQ may be sampled in at least some of the first to fourth sampling circuits. In such a case, the data signal DQ may not be accurately sampled in at least one of the first to fourth sampling circuits.

With reference to the above, in an example embodiment, the host 200 may execute a training operation for adjusting phases of the first to fourth clock signals CK0 to CK3 and the data signal DQ, so that the memory device 300 may accurately receive the data signal DQ transmitted from the host 200.

As an example, the host 200 may compare the first clock signal CK0 and the data signal DQ with each other, and adjust delay amounts of the first clock delay cell 211 and/or the data delay cell 215 so that a phase skew between the first clock signal CK0 and the data signal DQ is minimized and the rising edge of the first clock signal CK0 is aligned with the center of an eye opening of the data signal DQ. Thereafter, the host 200 may adjust a delay amount of each of the second to fourth clock delay cells 212 to 214 to adjust a phase of each of the second to fourth clock signals CK1 to CK3 based on the first clock signal CK0 or the data signal DQ.

The host 200 may also adjust, e.g., increase or decrease, a magnitude of a reference voltage input to the receivers RX receiving the data signal DQ in the memory device 300 in the training operation.

In addition, in an example embodiment, the host 200 may control a delay amount of each of the second to fourth clock delay cells 212 to 214 to adjust a phase of each of the second to fourth clock signals CK1 to CK3 based on the first clock signal CK0, on which the delay amount of the first delay cell 211 is applied. Accordingly, the phase skew between the first to fourth clock signals CK0 to CK3 may be removed. Thereafter, the host 200 may adjust a delay amount of the data delay cell 215 so that the rising edge of each of the first to fourth clock signals CK0 to CK3 is aligned with the eye opening of the data signal DQ.

As described above, in the memory system SYS according to an example embodiment, the host 200 may adjust the phase of each of the data signal DQ and the first to fourth clock signals CK0 to CK3, and then output the data signal DQ and the first to fourth clock signals CK0 to CK3 so that the data signal DQ and the first to fourth clock signals CK0 to CK3 are accurately aligned with each other in the sampling circuits receiving the data signal DQ in the memory device 300. In this regard, the phase skew between the data signal DQ and the first to fourth clock signals CK0 to CK3 may need to be minimized in the sampling circuits of the memory device 300, rather than in transmission paths between the host 200 and the memory device 300. Accordingly, in the memory system SYS, at least some of the data signal DQ output from the host 310 and the first to fourth clock signals CK0 to CK3 may be misaligned with each other in the transmission path between the host 200 and the memory device 300.

In an example embodiment, the training operation may be executed in a booting operation in which the host 200 and the memory device 300 are connected to start an operation. As an example, the host 200 may execute a training operation on frequencies that the first to fourth clock signals CK0 to CK3 and the data signal DQ may have at the time of performing booting. In this case, when the frequencies of the first to fourth clock signals CK0 to CK3 and/or the data signal DQ are changed, settings of the first to fourth clock delay cells 211 to 214 and the data delay cell 215 determined in the training operation executed at the time of performing the booting may be invoked and applied. In another implementation, the host 200 may perform the training operation whenever the frequency of at least one of the first to fourth clock signals CK0 to CK3 and the data signal DQ transmitted to the memory device 300 is changed. This will be described in additional detail below.

Figure 6:
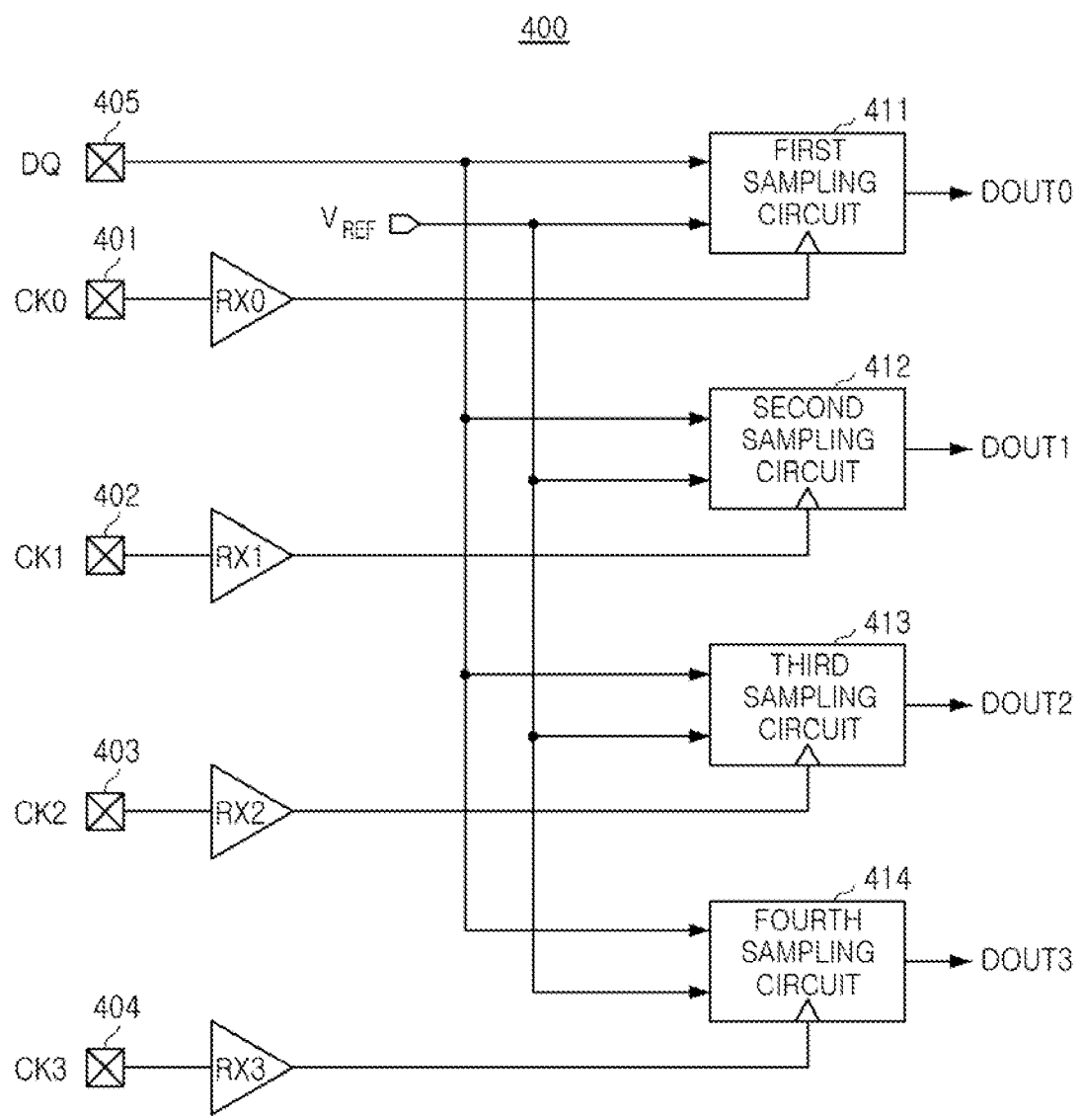
FIG. 6 is a schematic block diagram illustrating a memory device according to an example embodiment.

FIG. 6 is a schematic block diagram illustrating a memory device according to an example embodiment.

Referring to FIG. 6, a memory device 400 according to an example embodiment may include a plurality of pads 401 to 405, a plurality of receivers RX0 to RX3, and a plurality of sampling circuits 411 to 414.

The plurality of pads 401 to 405 may be connected to pads of an external host through signal transmission paths. The plurality of pads 401 to 405 may include first to fourth clock pads 401 to 404 receiving first to fourth clock signals CK0 to CK3 and a data pad 405 receiving a data signal DQ.

Each of the plurality of sampling circuits 411 to 414 may include a receiver comparing the data signal DQ with a reference voltage $V_{REF}$, and a flip-flop storing an output of the receiver.

First to fourth receivers RX0 to RX3 may receive the first to fourth clock signals CK0 to CK3 output from the host through the first to fourth clock pads 401 to 404, respectively. The first to fourth clock signals CK0 to CK3 received by the first to fourth receivers RX0 to RX3 may be input to first to fourth sampling circuits 411 to 414, respectively. Accordingly, the first sampling circuit 411 may operate in synchronization with the first clock signal CK0, the second sampling circuit 412 may operate in synchronization with the second clock signal CK1, the third sampling circuit 413 may operate in synchronization with the third clock signal CK2, and the fourth sampling circuit 414 may operate in synchronization with the fourth clock signal CK3.

In a training operation of aligning phases of the first to fourth clock signals CK0 to CK3 and the data signal DQ with each other, the memory device 400 may receive the data signal DQ including sample data, which is generated by the host for training.

The data signal DQ transferred through the data pad 405 may be simultaneously input to the first to fourth sampling circuits 411 to 414. Since the first to fourth clock signals CK0 to CK3 determine operation timings of the first to fourth sampling circuits 411 to 414 and have respectively different phases, the first to fourth sampling circuits 411 to 414 may sample data included in the data signal DQ at different timings.

In an example embodiment, each of the first to fourth sampling circuits 411 to 414 may sample data included in the data signal DQ by comparing the data signal DQ at a rising edge of each of the first to fourth clock signals CK0 to CK3 with the reference voltage $V_{REF}$.

In an example embodiment, the data signal DQ may include first to fourth data DOUT0 to DOUT3, which are sequentially received at the data pad 405. The first sampling circuit 411 may sample the first data DOUT0 at the rising edge of the first clock signal CK0, and the second sampling circuit 412 may sample the second data DOUT1 at the rising edge of the second clock signal CL1 having a phase difference of 90° with respect to the first clock signal CK0. The second sampling circuit 412 may not sample the first data DOUT0.

Similarly, the third sampling circuit 413 may sample the third data DOUT2 at the rising edge of the third clock signal CK2 having a phase difference of 180° with respect to the first clock signal CK0. Since the rising edge of the third clock signal CK2 does not appear while the first data DOUT0 and the second data DOUT1 are input to the third sampling circuit 413, the third sampling circuit 413 may not sample the first data DOUT0 and the second data DOUT1.

Similarly, the fourth sampling circuit 414 may sample the fourth data DOUT3 at the rising edge of the fourth clock signal CK3 having a phase difference of 270° with respect to the first clock signal CK0.

Accordingly, during a time corresponding to one cycle of each of the first to fourth clock signals CK0 to CK3, the data signal DQ received by the memory device 400 from the host may include four pieces of data, i.e., the first to fourth data DOUT0 to DOUT3.

The memory device 400 may convert the first to fourth data DOUT0 to DOUT3 sampled by the first to fourth sampling circuits 411 to 414 into the data signal DQ, and transmit the data signal DQ to the host through the data pad 405. The memory device 400 may write the first to fourth data DOUT0 to DOUT3 to a memory cell array and read the first to fourth data DOUT0 to DOUT3 again to generate the data signal DQ. Alternatively, in an example embodiment, the memory device 400 may write the first to fourth data DOUT0 to DOUT3 to a separate register other than the memory cell array, generate the data signal DQ, and then transmit the data signal DQ to the host through the data pad 405.

The host receiving the data signal DQ including the first to fourth data DOUT0 to DOUT3 may compare the first to fourth data DOUT0 to DOUT3 with the sample data transmitted to the memory device 400, and execute a training operation of adjusting phases of the first to fourth clock signals CK0 to CK3 and the data signal DQ. For example, the host may adjust a magnitude of the reference voltage $V_{REF}$ input to each of the first to fourth sampling circuits 411 to 414 of the memory device 400 during the training operation.

The training operation may be continued until the rising edge of each of the first to fourth clock signals CK0 to CK3 is positioned at the center of an eye opening of the data signal DQ in each of the first to fourth sampling circuits 411 to 414.

Figure 7:
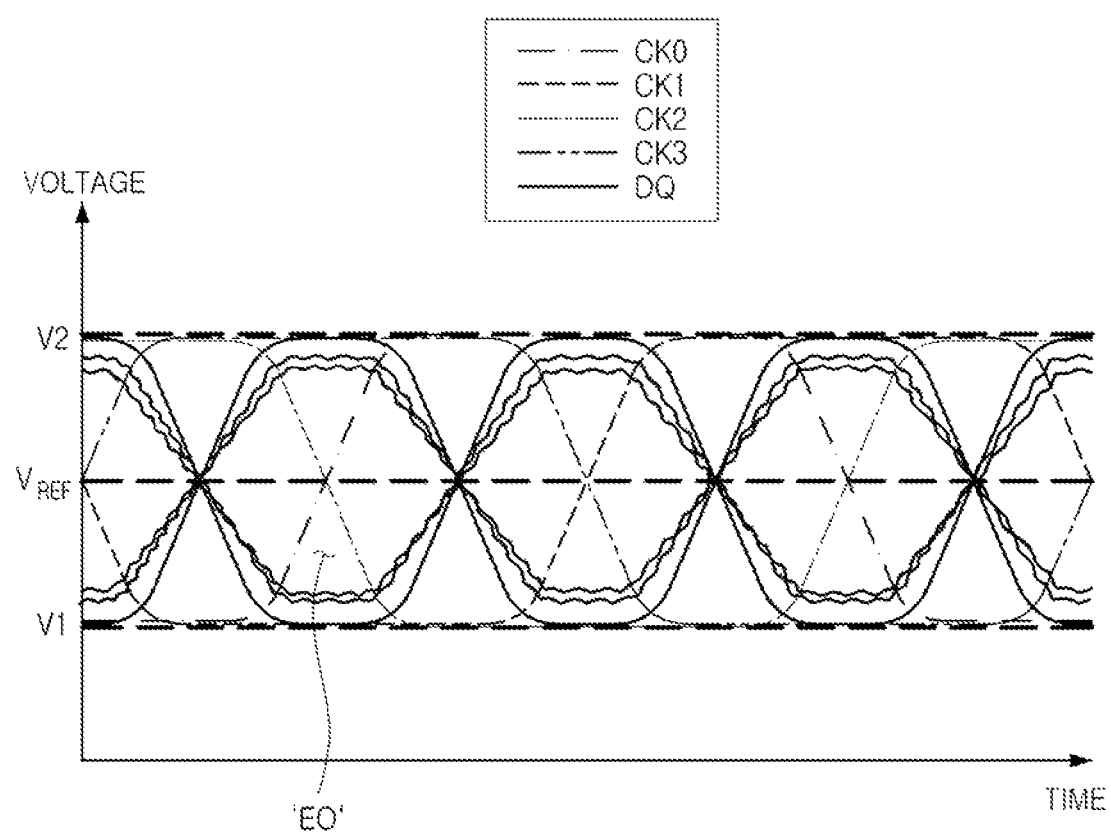
FIG. 7 is a waveform diagram provided in order to describe a training operation of a host connected to a memory device according to an example embodiment.

FIG. 7 is a waveform diagram provided in order to describe a training operation of a host connected to a memory device according to an example embodiment.

Referring to FIG. 7, a data signal DQ and first to fourth clock signals CK0 to CK3 transmitted from the host to the memory device are illustrated. As an example, the data signal DQ and the first to fourth clock signals CK0 to CK3 illustrated in FIG. 7 may be signals input to sampling circuits included in the memory device.

The first to fourth clock signals CK0 to CK3 may have different phases. As an example, the second to fourth clock signals CK1 to CK3 may have phase differences of 90°, 180°, and 270° with respect to the first clock signal CK0, respectively. The first to fourth clock signals CK0 to CK3 may have the same frequency.

A frequency of the data signal DQ may be different from the frequency of each of the first to fourth clock signals CK0 to CK3. As an example, the frequency of the data signal DQ may be twice the frequency of each of the first to fourth clock signals CK0 to CK3.

The host may position a rising edge of each of the first to fourth clock signals CK0 to CK3 at the center of an eye opening EO of the data signal DQ by executing the training operation.

As an example, during the training operation, the host may adjust phases of the data signal DQ and at least one of the first to fourth clock signals CK0 to CK3 transmitted to the memory device. In addition, during the training operation, the host may adjust a magnitude of the reference voltage $V_{REF}$ input to the sampling circuits in the memory device.

Figure 8:
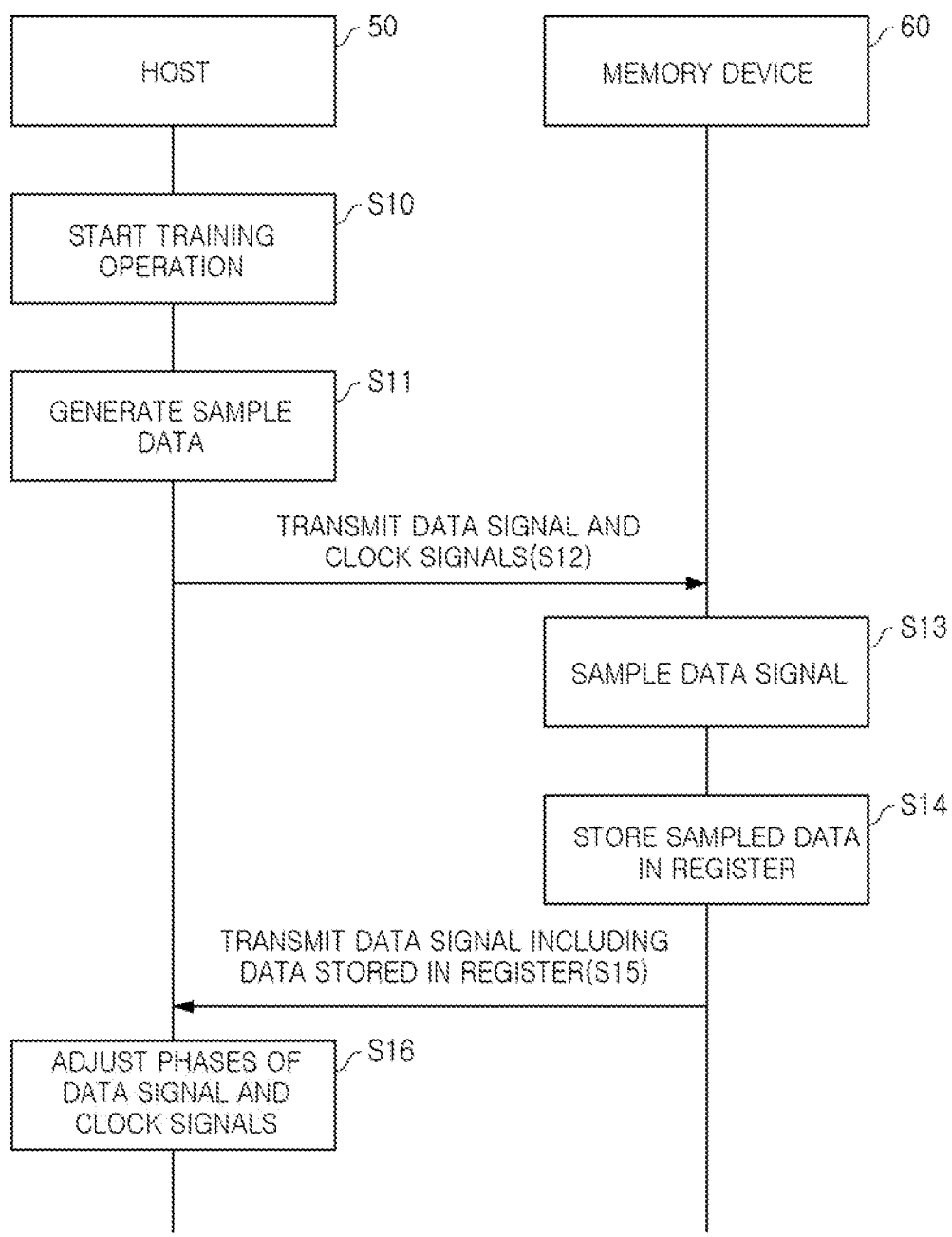
FIG. 8 is a flowchart provided in order to describe an operation of a memory system according to an example embodiment.

FIG. 8 is a flowchart provided in order to describe an operation of a memory system according to an example embodiment.

Referring to FIG. 8, a memory system according to an example embodiment may include a host 50 and a memory device 60. The host 50 may transmit a plurality of clock signals to the memory device 60, and the memory device 60 may operate using the plurality of clock signals. As an example, the host 50 may transmit four clock signals having different phases to the memory device 60.

When the memory system including the host 50 and the memory device 60 is booted, the host 50 may start a training operation (S10). Alternatively, when an operating frequency of the memory device 60 is changed, the host 50 may start a training operation. The training operation may be an operation of adjusting phases of clock signals and a data signal transmitted from the host 50 to the memory device 60. The data signal and the clock signals may be accurately aligned with each other sampling circuits or the like sampling the data signal in the memory device 60 by the training operation.

When the training operation starts, the host 50 may generate sample data (S11). As an example, the sample data may be any data generated by the host 50 for the training operation. The host 50 may transmit the data signal including the sample data to the memory device 60 together with the clock signals (S12).

The memory device 60 may sample the data signal received from the host 50 (S13). As described above with reference to FIG. 6, the memory device 60 may sequentially sample the sample data included in the data signal in four sampling circuits, and the four sampling circuits may operate in synchronization with respective ones of the four clock signals received from the host 50. The memory device 60 may store the sampled data in a register (S14). However, according to example embodiments, the sampled data may be stored in a memory cell array of the memory device 60 rather than the register.

The memory device 60 may generate a data signal including the data stored in the register and transmit the data signal to the host 50 (S15). As an example, the memory device 60 may generate a data signal including the data stored in the register in response to a data transmission request from the host 50, and transmit the data signal to the host 50.

The host 50 may compare the data included in the data signal received from the memory device 60 with sample data, and adjust the phases of the data signal and the clock signals based on a comparison result (S16). As an example, the host 50 may adjust phases of a first clock signal of the clock signals and the data signal, and then adjust phases of the second to fourth clock signals based on the first clock signal or the data signal. In addition, in an example embodiment, the host 50 may adjust the phases of the second to fourth clock signals based on the first clock signal, adjust the phase of the data signal, and align the data signal and the first to fourth clock signals with each other. According to example embodiments, the host 50 may adjust a magnitude of a reference voltage input to the sampling circuits of the memory device 60 together with the phases of the data signal and the clock signals.

Figure 9:
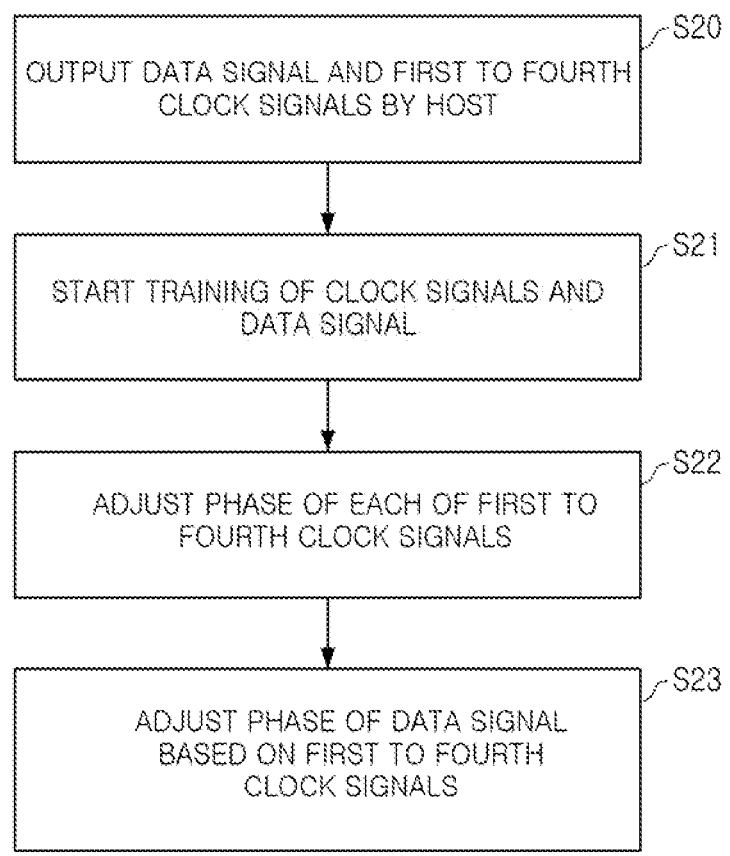
FIG. 9 is a flowchart provided in order to describe an operation of a memory system according to an example embodiment.

FIG. 9 is a flowchart provided in order to describe an operation of a memory system according to an example embodiment.

Referring to FIG. 9, an operation of the memory system according to an example embodiment may start with outputting the data signal and the first to fourth clock signals to the memory device by the host (S20). The second to fourth clock signals may have respective phase differences of 90°, 180°, and 270° with respect to the first clock signal.

The host may start a training operation of adjusting phases of the data signal and the first to fourth clock signals output to the memory device to align rising edges of the first to fourth clock signals with the center of an eye opening of the data signal (S21). As an example, the training operation may be an operation of aligning the eye opening of the data signal and the rising edges of the first to fourth clock signals with each other in each of circuits inside the memory device, for example, sampling circuits that sample data included in the data signal.

In the example embodiment illustrated in FIG. 9, the host may first adjust the phase of each of the first to fourth clock signals (S22). As an example, the host may select one of the first to fourth clock signals as a reference clock and adjust phase differences between the reference clock and other clock signals. When the first clock signal is selected as the reference clock, the host may adjust delay amounts of delay cells connected to transmitters outputting the second to fourth clock signals so that the second to fourth clock signals have phase differences of 90°, 180°, and 270° with respect to the first clock signal, respectively.

When the phase of each of the first to fourth clock signals is adjusted, the host may adjust the phase of the data signal based on the first to fourth clock signals (S23). While the first to fourth clock signals (for which the adjustment of the phases in S22 is completed) are input to the sampling circuits of the memory device, the host may change the phase of the data signal (which includes the sample data) and transmit the data signal to the memory device, and may receive a data signal transmitted by the memory device after the memory device samples the data signal. The host may compare data included in the data signal received from the memory device with sample data transmitted earlier, in order to determine whether or not the received data coincides with the sample data.

As an example, the host may receive the data signal from the memory device while retarding or advancing the phase of the data signal, and may determine whether or not data included in the received data signal coincides with the sample data. In such a manner, the host may determine the eye opening of the data signal received by the memory device, and determine the phase of the data signal so that the rising edges of the first to fourth clock signals may be stably positioned within the eye opening.

Figure 10:
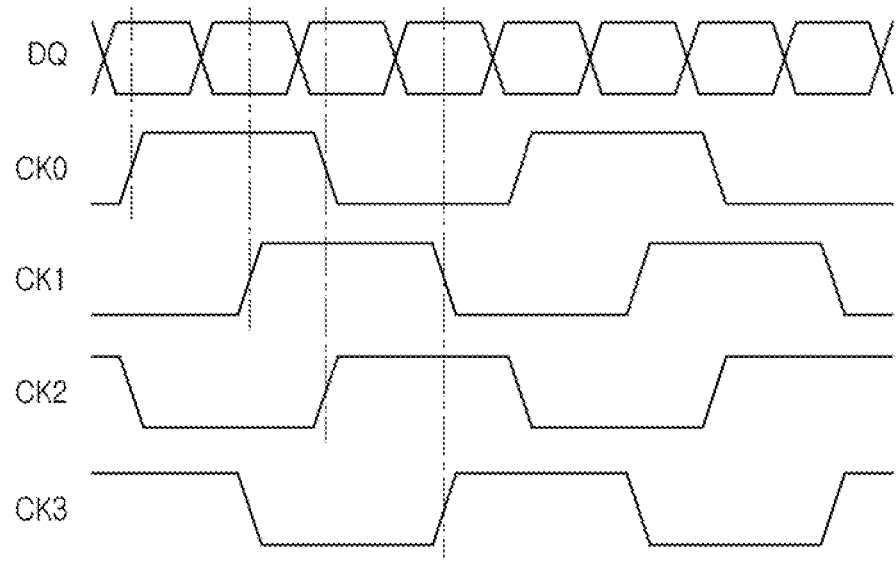
FIGS. 10 to 12 are waveform diagrams provided in order to describe an operation of a semiconductor device according to an example embodiment.
Figure 11:
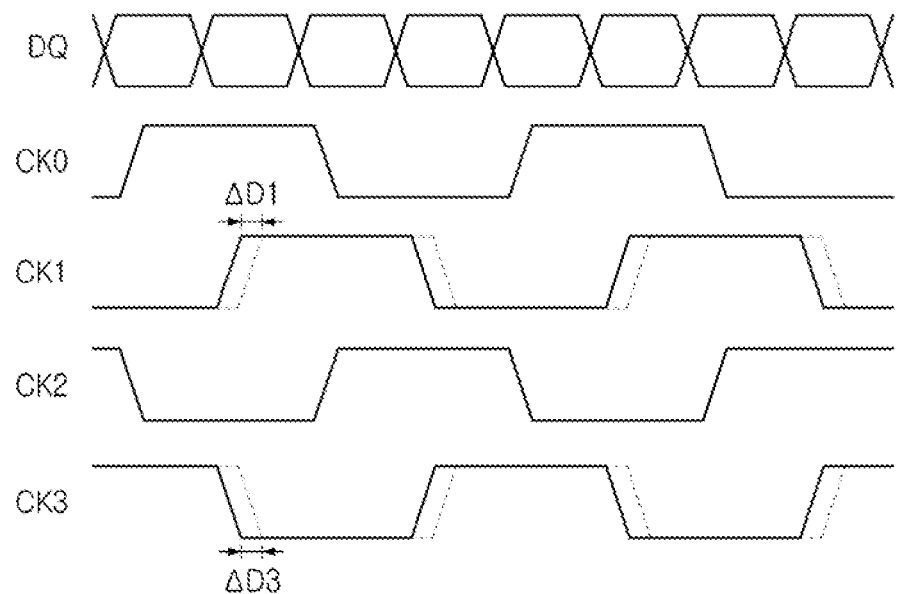
Figure 12:
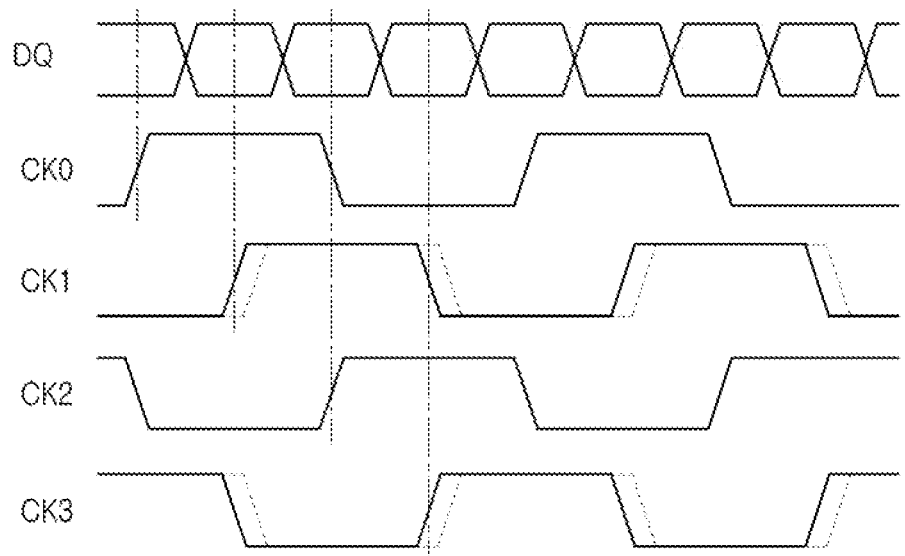

FIGS. 10 to 12 are waveform diagrams provided in order to describe an operation of a semiconductor device according to an example embodiment.

First, FIG. 10 is a waveform diagram illustrating a data signal DQ and first to fourth clock signals CK0 to CK3 received by the memory device from the host before a training operation.

Before the training operation, as illustrated in FIG. 10, phases of the data signal DQ and the first to fourth clock signals CK0 to CK3 received by the memory device may not be accurately aligned with each other. As an example, a rising edge of the first clock signal CK0 may not be positioned at the center of an eye opening of the data signal DQ.

When the training operation starts, the host may first adjust the phase of each of the first to fourth clock signals CK0 to CK3, as illustrated in FIG. 11. In an example embodiment illustrated in FIG. 11, the host may adjust the phases of the second to fourth clock signals CK1 to CK3 based on the first clock signal CK0. In an ideal case, phase differences of the second to fourth clock signals CK1 to CK3 with respect to the first clock signal CK0 may be 90°, 180°, and 270°, respectively.

Referring to FIG. 11, the host may determine a delay amount of the second clock delay cell determining the phase of the second clock signal CK1 as a second delay amount ΔD1 so that that a phase difference between the first clock signal CK0 and the second clock signal CK1 is 90°. In addition, referring to FIG. 11, the host may determine a delay amount of the fourth clock delay cell determining the phase of the fourth clock signal CK3 as a fourth delay amount ΔD3 so that that the fourth clock signal CK3 has a phase difference of 270° with respect to the first clock signal CK0. Through the operations described above, the phases of the first to fourth clock signals CK0 to CK3 may be aligned with each other within the memory device.

Next, referring to FIG. 12, the host may adjust the phase of the data signal DQ so that rising edges of the first to fourth clock signals CK0 to CK3 are aligned with the center of the eye opening of the data signal DQ or to be as close to the center of the eye opening of the data signal DQ as possible. In an example embodiment illustrated in FIG. 12, the host may advance the phase of the data signal DQ to align the center of the eye opening of the data signal DQ and the rising edges of the first to fourth clock signals CK0 to CK3 with each other. Accordingly, after the training operation, a phase difference between the data signal DQ and each of the first to fourth clock signals CK0 to CK3 as well as the phase differences between the first to fourth clock signals CK0 to CK3 may be adjusted.

The data signal DQ and the first to fourth clock signals CK0 to CK3 of which the phases are adjusted as illustrated in FIG. 12 may be signals received by the memory device, and may be, for example, signals at receiving ends of the sampling circuits that sample the data signal DQ. It is possible that lengths of transmission paths from the pads receiving the data signal DQ and the first to fourth clock signals CK0 to CK3 to the receiving ends of the sampling circuits may be different from each other. Accordingly, in the pads of the memory device, the phases of the data signal DQ and the first to fourth clock signals CK0 to CK3 may appear different from phases illustrated in FIG. 12. As an example, the data signal DQ and the first to fourth clock signals CK0 to CK3 may be misaligned with each other in the pads of the memory device after the training operation.

Figure 13:
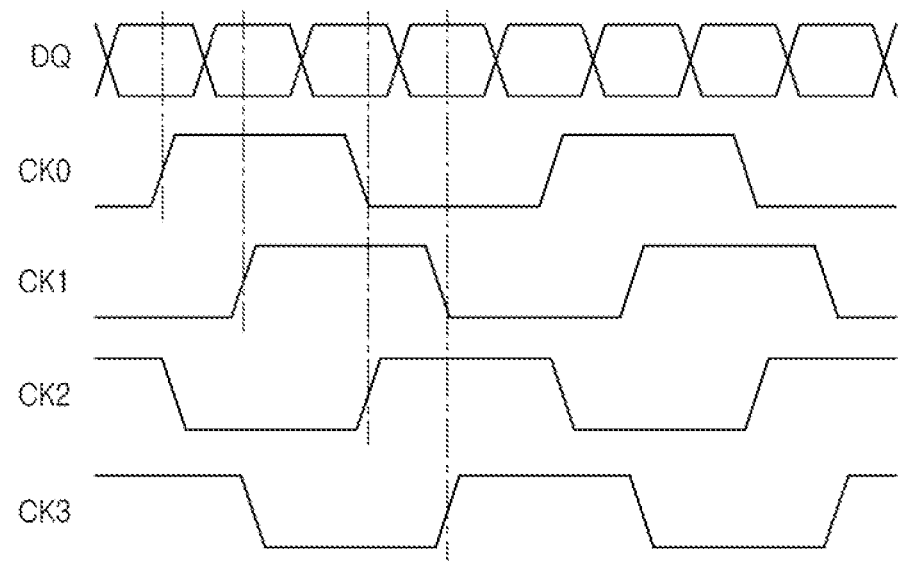
FIGS. 13 to 15 are waveform diagrams provided in order to describe an operation of a semiconductor device according to an example embodiment.
Figure 14:
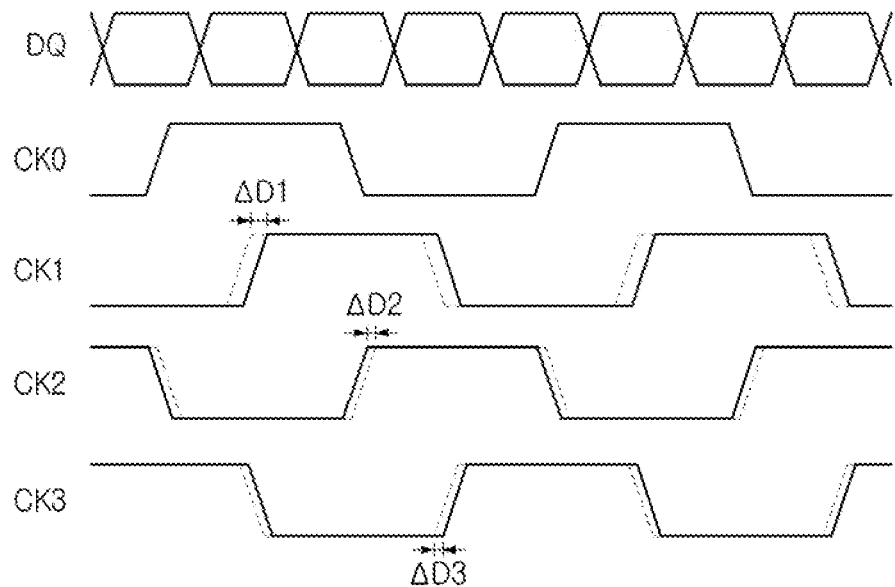
Figure 15:
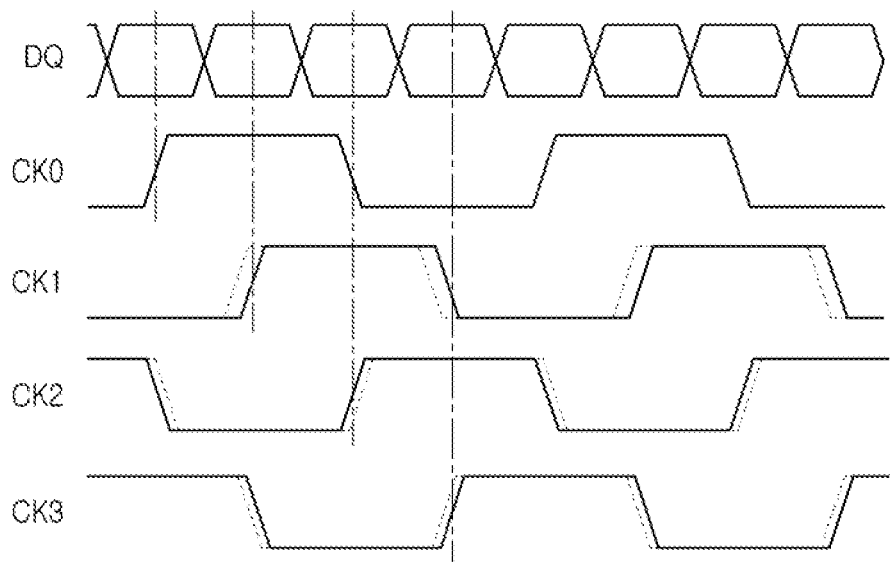

FIGS. 13 to 15 are waveform diagrams provided in order to describe an operation of a semiconductor device according to an example embodiment.

First, FIG. 13 is a waveform diagram illustrating a data signal DQ and first to fourth clock signals CK0 to CK3 received by the memory device from the host before a training operation.

As described above, before the training operation, phases of the data signal DQ and the first to fourth clock signals CK0 to CK3 received by the memory device may not be accurately aligned with each other. In an example embodiment illustrated in FIG. 13, a rising edge of each of the first to third clock signals CK0 to CK2 may be offset from the center of an eye opening of the data signal DQ.

In the training operation, the host may first adjust the phase of each of the first to fourth clock signals CK0 to CK3 as illustrated in FIG. 14. Referring to FIG. 14, the host may determine a delay amount of the second clock delay cell determining the phase of the second clock signal CK1 as a second delay amount ΔD1 so that that a phase difference between the first clock signal CK0 and the second clock signal CK1 is 90°. In addition, the host may determine a delay amount of the third clock delay cell determining the phase of the third clock signal CK2 as a third delay amount ΔD2 so that that a phase difference between the first clock signal CK0 and the third clock signal CK2 is 180°. In addition, the host may determine a delay amount of the fourth clock delay cell determining the phase of the fourth clock signal CK3 as a fourth delay amount ΔD3 so that that the fourth clock signal CK3 has a phase difference of 270° with respect to the first clock signal CK0.

When the phase differences between the first to fourth clock signals CK0 to CK3 are adjusted, the host may adjust the phase of the data signal DQ. Referring to FIG. 15, the host may align the rising edges of the first to fourth clock signals CK0 to CK3 and the center of the eye opening of the data signal DQ with each other by retarding the phase of the data signal DQ. Similar to that described above, the data signal DQ and the first to fourth clock signals CK0 to CK3 of which the phases are adjusted as illustrated in FIG. 15 may be signals received by the memory device, for example, signals at receiving ends of the sampling circuits sampling the data signal DQ and outputting the data included in the data signal.

Figure 16:
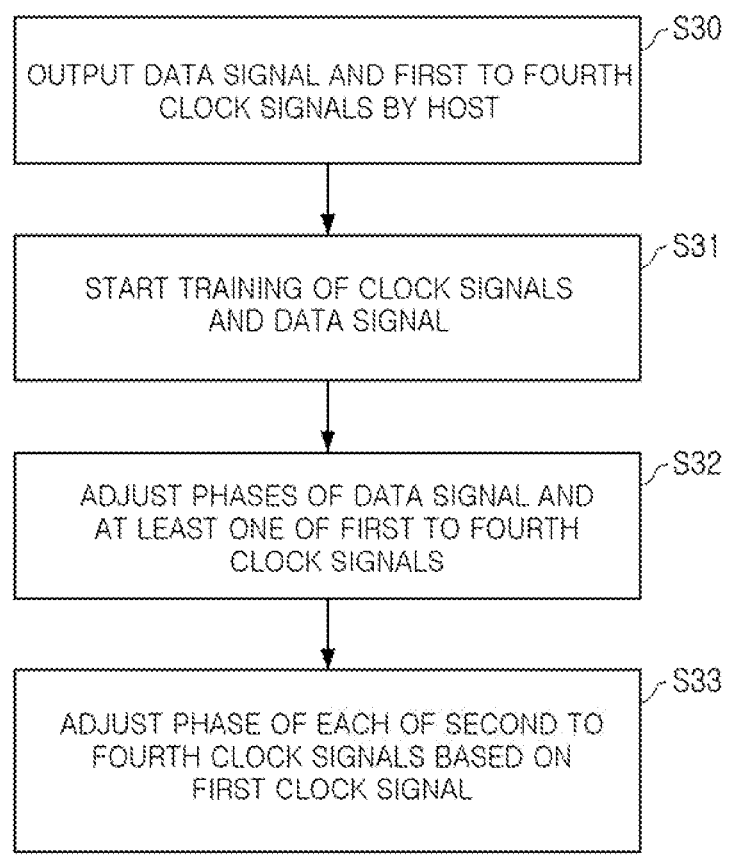
FIG. 16 is a flowchart provided in order to describe an operation of a memory system according to an example embodiment.

FIG. 16 is a flowchart provided in order to describe an operation of a memory system according to an example embodiment.

Referring to FIG. 16, an operation of the memory system according to an example embodiment may start with outputting the data signal and the first to fourth clock signals to the memory device by the host (S30). Each of the second to fourth clock signals may have a phase difference of 90°, 180°, and 270° with respect to the first clock signal.

The host may start a training operation of adjusting phases of the data signal and the first to fourth clock signals output to the memory device to align rising edges of the first to fourth clock signals with the center of an eye opening of the data signal (S31). In an example embodiment illustrated in FIG. 16, the host may first adjust the phases of one of the first to fourth clock signals and the data signal (S32). As an example, the host may adjust the phases of the data signal and the first clock signal to align the rising edge of the first clock signal with the center of the eye opening of the data signal.

When the phases of the data signal and the first clock signal are aligned with each other, the host may adjust the phase of each of the second to fourth clock signals based on the first clock signal (S33). The host may adjust delay amounts of clock delay cells connected to transmitters outputting the second to fourth clock signals so that the second to fourth clock signals have phase difference of 90°, 180°, and 270° with respect to the first clock signal, respectively.

FIGS. 17 to 21 are waveform diagrams provided in order to describe an operation of a semiconductor device according to an example embodiment.

Figure 17:
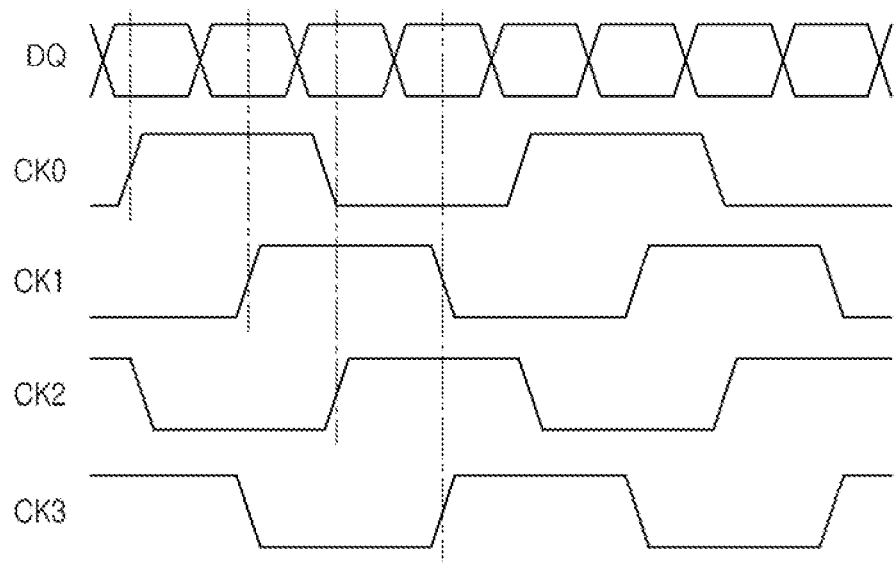
FIGS. 17 to 21 are waveform diagrams provided in order to describe an operation of a semiconductor device according to an example embodiment.

FIG. 17 is a waveform diagram illustrating a data signal DQ and first to fourth clock signals CK0 to CK3 received by the memory device from the host before a training operation. Before the training operation, as illustrated in FIG. 17, phases of the data signal DQ and the first to fourth clock signals CK0 to CK3 received by the memory device may not be accurately aligned with each other.

Figure 18:
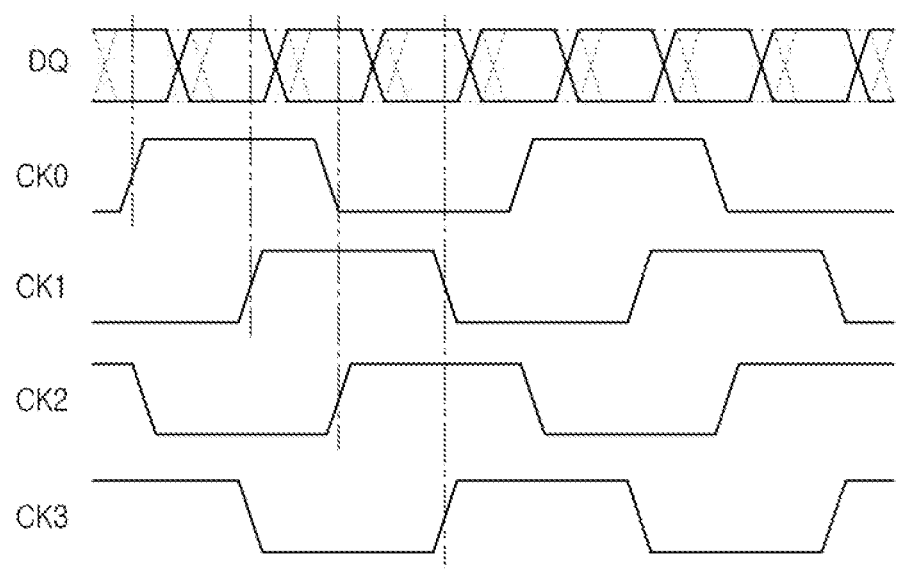

When the training operation starts, the host may adjust the phases of one of the first to fourth clock signals CK0 to CK3 and the data signal DQ. In the example embodiment illustrated in FIG. 18, the phase of the data signal DQ may be adjusted based on the first clock signal CK0. Accordingly, the host may change a delay amount of the data delay cell connected to the transmitter outputting the data signal DQ. Referring to FIG. 18, the host may align a rising edge of the first clock signal CK0 with the center of the eye opening of the data signal DQ by advancing the phase of the data signal DQ.

Next, the host may adjust the phase of each of the second to fourth clock signals CK1 to CK3 based on the data signal DQ or the first clock signal CK0. First, referring to FIG. 19, the host may adjust the phase of the second clock signal CK1 based on the first clock signal CK0 or the data signal DQ. For example, the host may adjust the phase of the second clock signal CK1 so that the second clock signal has a phase difference of 90° with respect to the first clock signal CK0. In addition, in an example embodiment, the host may adjust the phase of the second clock signal CK1 so that a rising edge of the second clock signal CK1 is positioned at the center of the eye opening of the data signal DQ.

Figure 19:
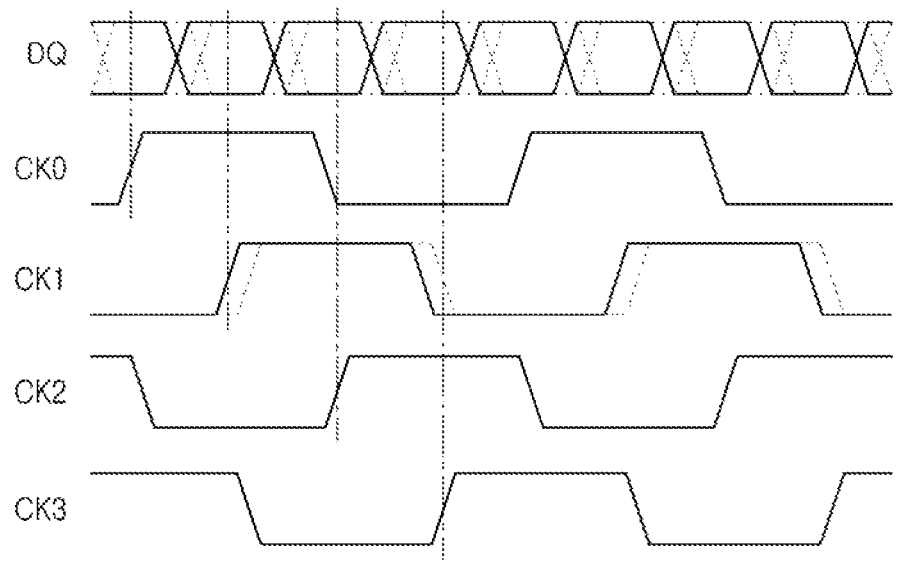
Figure 20:
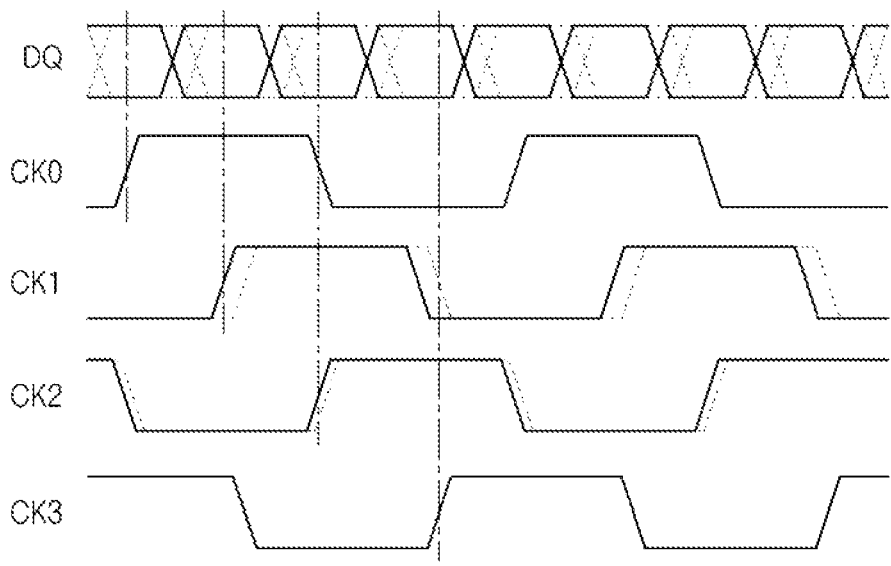
Figure 21:
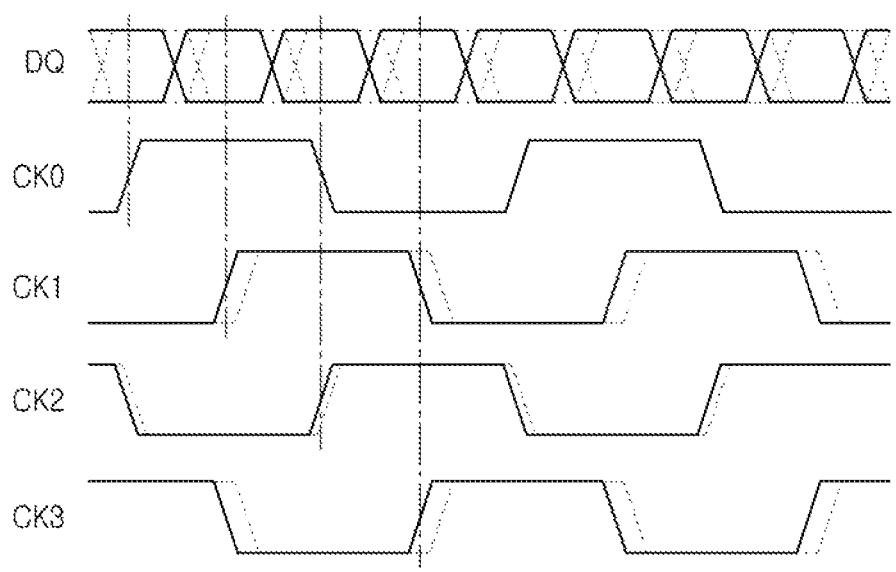

Next, referring to FIGS. 20 and 21, the host may adjust the phase of each of the third clock signal CK2 and the fourth clock signal CK3 based on the data signal DQ or the first clock signal CK0. As described with reference to FIG. 19, the host may adjust delay amounts of delay cells connected to transmitters outputting the third clock signal CK2 and the fourth clock signal CK3 so that the third clock signal CK2 and the fourth clock signal CK3 have phase differences of 180° and 270° with respect to the first clock signal CK0, respectively. Alternatively, for the third clock signal CK2 and the fourth clock signal CK3, the host may adjust delay amounts of delay cells connected to transmitters outputting the third clock signal CK2 and the fourth clock signal CK3 so that a rising edge of each of the third clock signal CK2 and the fourth clock signal CK3 is positioned at the center of the eye opening of the data signal DQ.

In the example embodiment described with reference to FIGS. 19 to 21, the phases of the second to fourth clock signals CK1 to CK3 may be simultaneously adjusted. In addition, when the training operation is executed in a manner of aligning the rising edge of each of the second to fourth clock signals CK1 to CK3 with the center of the eye opening of the data signal DQ, the phase differences between the first clock signal CK0 and the second to fourth clock signals CK1 to CK3 after the training operation ends may not be 90°, 180°, and 270°, respectively.

In various example embodiments, the data signal DQ may be a multi-level signal capable of transmitting two or more bits of data at a time. When the data signal DQ is a multi-level signal capable of transmitting two bits of data at a time, the data signal DQ may have one of four levels, and each of the sampling circuits of the memory device may compare the data signal DQ with three different reference voltages. Accordingly, in the training operation of aligning the phases of the clock signals and the data signal DQ with each other, described above, the host may adjust magnitudes of the three reference voltages for sampling the data signal DQ together.

Figure 22:
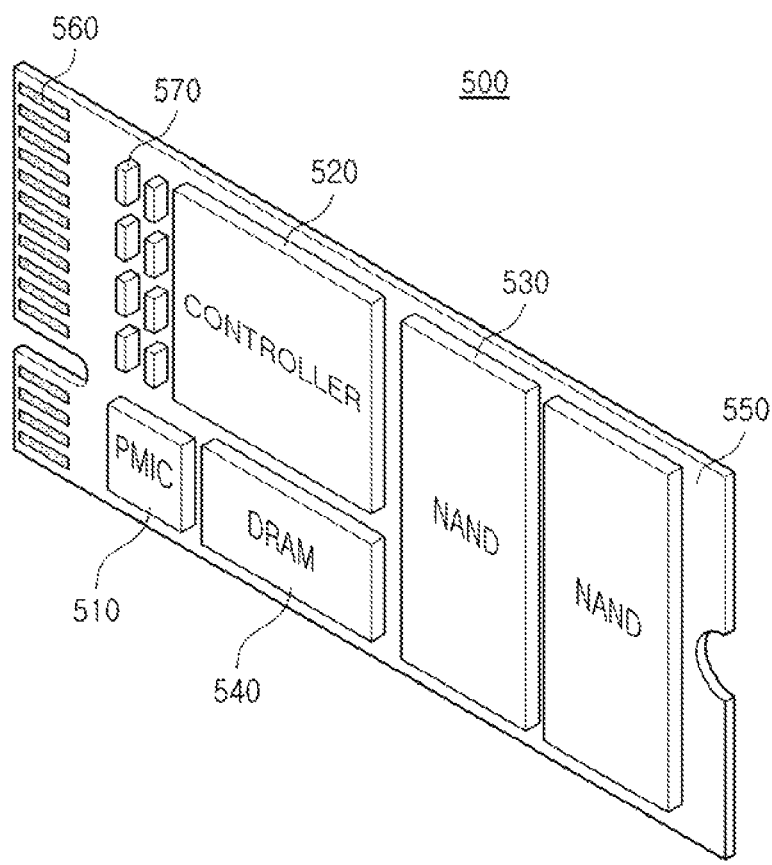
FIG. 22 is a schematic block diagram illustrating a memory system according to an example embodiment.

FIG. 22 is a schematic block diagram illustrating a memory system according to an example embodiment.

A memory system 500 according to an example embodiment illustrated in FIG. 22 may be a solid state drive (SSD). The memory system 500 may have a form factor according to an M.2 standard, and may communicate with an external central processing unit, a system-on-chip, an application processor, or the like, according to a peripheral component interconnect express (PCIe) protocol.

The memory system 500 may include a power management integrated circuit (PMIC) 510, a controller 520, a NAND memory 530, a DRAM 540, and the like. The PMIC 510, the controller 520, the NAND memory 530, the DRAM 540, and the like, may be mounted on a system board 550, and connector pins 560 and component elements 570 may be disposed on the system board 550. The connector pins 560 may be in contact with pins of a computer device and/or a server device in which the memory system 500 is mounted. The component elements 570 may include passive elements such as resistors and capacitors required for an operation of the memory system 500.

The controller 520 may control the memory system 500 according to a control command from the computer device and/or the server device. The controller 520 may store data received through the connector pins 560 in the NAND memory 530 and/or the DRAM 540 or may read data stored in the NAND memory 530 and/or the DRAM 540 and output the read data to the computer device and/or the server device. The PMIC 510 may distribute power supplied to the connector pins 560 to the controller 520, the NAND memory 530, the DRAM 540, and the like.

The controller 520 may be connected to the NAND memory 530 and the DRAM 540 through wirings formed on the system board 550. As an example, the controller 520 may provide a plurality of clock signals required for operations of the NAND memory 530 and/or the DRAM 540, and may exchange a data signal with the NAND memory 530 and the DRAM 540. In an example embodiment, the controller 520 may execute a training operation of adjusting phases of clock signals and a data signal so that the phases of the clock signals and the data signal are aligned with each other within the NAND memory 530 and/or the DRAM 540. As an example, the controller 520 may execute the training operation when the memory system 500 is initially booted or when an operating frequency of the NAND memory 530 and/or the DRAM 540 is changed.

By way of summation and review, in order to improve a communication rate between a memory device and a controller, a plurality of clock signals having different phases may be used as strobe signals.

Example embodiments may provide a semiconductor device capable of increasing a data transfer rate and reliability of data transfer by aligning the clock signals and a data signal with each other through training. According to example embodiments, phases of four clock signals and data signal may be aligned with each other in a semiconductor device communicating with a memory device, so that a phase skew between the four clock signals received by the memory device is removed and phase errors between the four clock signals and the data signal are minimized in the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system, comprising:
a plurality of pads connected to a memory device, the memory device being configured to receive a data signal using first to fourth clock output signals, the first to fourth clock output signals having different phases;
a data transmission/reception circuit configured to input and output the data signal to a data pad among the plurality of pads, the data transmission/reception circuit including a data delay cell configured to adjust a phase of the data signal;
a clock output circuit configured to generate first to fourth clock input signals and output the first to fourth clock output signals to a plurality of clock pads among the plurality of pads, the clock output circuit including first to fourth clock delay cells, the first to fourth clock delay cells being configured to receive the first to fourth clock input signals, adjust phases of the first to fourth clock input signals, and produce the first to fourth clock output signals having the different phases; and
a controller configured to:
adjust, based upon the phase of the first clock output signal, the phases of the second to fourth clock output signals using the second to fourth clock delay cells; and
after adjusting the phases of the second to fourth clock output signals, adjust a phase of the data signal using the data delay cell to align a center of an eye opening of the data signal with rising edges of the first to fourth clock output signals in a sampling circuit.

2. The memory system as claimed in claim 1,
wherein the second clock output signal has a phase difference of 90° with respect to the first clock output signal,
wherein the third clock output signal has a phase difference of 180° with respect to the first clock output signal, and
wherein the fourth clock output signal has a phase difference of 270° with respect to the first clock output signal.

3. The memory system as claimed in claim 1,
wherein the sampling circuit is connected to the data pad and included in the memory device.

4. The memory system as claimed in claim 3, wherein the controller is configured to misalign the data signal output to the data pad with at least one of the first to fourth clock output signals output to the clock pads prior to adjusting the phases of the second to fourth clock output signals based upon the phase of the first clock output signal.

5. The memory system as claimed in claim 1,
wherein the data delay cell is connected to the data pad, and
wherein the controller is configured to adjust a delay amount of the data delay cell so that the data signal output from the data pad is aligned with the first clock output signal.

6. The memory system as claimed in claim 1, wherein the data signal output by the data transmission/reception circuit through the data pad during one cycle of each of the first to fourth clock output signals includes four pieces of data.

7. The memory system as claimed in claim 1, wherein, in the data transmission/reception circuit, the data delay cell is connected to the data pad.

8. The memory system as claimed in claim 1, wherein at least one of the first to fourth clock output signals is provided as a system clock signal of the memory device.

9. The memory system as claimed in claim 8, wherein the plurality of pads do not include a pad transmitting a clock signal other than the first to fourth clock output signals.

10. The memory system as claimed in claim 1, wherein the controller is configured to:
adjust a delay amount of at least one of the data delay cell and the first clock delay cell so that the data signal and the first clock output signal are aligned with each other in the memory device, and
adjust a delay amount of each of the second to fourth clock delay cells based on the first clock output signal on which the delay amount of the first clock delay cell is applied.

11. The memory system as claimed in claim 1, wherein the controller is configured to:
adjust a delay amount of at least one of the data delay cell and the first clock delay cell so that the data signal and the first clock output signal are aligned with each other in the memory device, and
adjust a delay amount of each of the second to fourth clock delay cells based on the data signal on which the delay amount of the data delay cell is applied.

12. A memory system, comprising:
a host configured to generate first to fourth clock input signals and output first to fourth clock output signals, the first to fourth clock output signals having different phases; and
a memory device configured to operate using at least one of the first to fourth clock output signals as a system clock, store data received together with a program command from the host, and output data to the host in response to a read command received from the host,
wherein each of the memory device and the host includes at least one data pad connected to a transmission path of a data signal including the data, and first to fourth clock output pads connected to transmission paths of the first to fourth clock output signals,
wherein the host is configured to adjust a phase of each of the second to fourth clock output signals based on the first clock output signal and to adjust, after adjusting the phase of each of the second to fourth clock output signals, a phase of the data signal to align a center of an eye opening of the data signal with rising edges of the first to fourth clock output signals,
wherein the host includes a data delay cell configured to adjust the phase of the data signal and includes first to fourth clock delay cells configured to adjust the phase of the first to fourth clock output signals, and
wherein the first to fourth clock delay cells are configured to receive the first to fourth clock input signals and output the first to fourth clock output signals.

13. The memory system as claimed in claim 12, wherein the memory device includes:
first to fourth clock receivers connected to the first to fourth clock output pads; and
a sampling circuit operating in synchronization with one of the first to fourth clock output signals and sampling the data signal.

14. The memory system as claimed in claim 13, wherein the host is configured to adjust a delay amount of each of the data delay cell and the first to fourth clock delay cells so that the center of the eye opening of the data signal is aligned with the rising edges of the first to fourth clock output signals received by the sampling circuit.

15. The memory system as claimed in claim 14, wherein the first to fourth clock output signals and the data signal are misaligned with each other at the data pad and the first to fourth clock output pads of the memory device prior to adjusting the phase of the second to fourth clock output signals based upon the phase of the first clock output signal.

16. The memory system as claimed in claim 13, wherein the memory device is configured to increase or decrease a reference voltage input to the sampling circuit so that the center of the eye opening of the data signal is aligned with the rising edges of the first to fourth clock output signals received by the sampling circuit.

17. A memory system, comprising:
a host configured to generate first to fourth clock input signals and to output first to fourth clock output signals, the first to fourth clock output signals having different phases; and
a memory device configured to operate using at least one of the first to fourth clock output signals as a system clock, store data received together with a program command from the host, and output data to the host in response to a read command received from the host,
wherein each of the memory device and the host includes at least one data pad connected to a transmission path of a data signal including the data, and first to fourth clock output pads connected to transmission paths of the first to fourth clock output signals,
wherein the host is configured to adjust a phase of each of the second to fourth clock output signals based on the first clock output signal and to adjust, after adjusting the phase of each of the second to fourth clock output signals, a phase of the data signal to align a center of an eye opening of the data signal with rising edges of the first to fourth clock output signals,
wherein the host includes a data delay cell configured to adjust the phase of the data signal and includes first to fourth clock delay cells configured to adjust the phase of the first to fourth clock output signals, and
wherein the first to fourth clock delay cells are configured to receive the first to fourth clock input signals and to output the first to fourth clock output signals.

18. The memory system as claimed in claim 17, wherein the memory device is configured to generate the system clock using a pair of clock signals having a phase difference of 180° therebetween among the first to fourth clock output signals.

19. The memory system as claimed in claim 17, wherein the memory device includes:
a data receiver connected to the data pad;
first to fourth clock receivers connected to the first to fourth clock output pads; and
first to fourth sampling circuits configured to sample the data signal at the rising edges of the first to fourth clock output signals.

20. The memory system as claimed in claim 19, wherein each of the first to fourth sampling circuits includes a flip-flop.

* * * * *